US011497112B2

(12) United States Patent
Zhou et al.

(10) Patent No.: US 11,497,112 B2
(45) Date of Patent: Nov. 8, 2022

(54) DRIVER BOARD ASSEMBLIES AND METHODS OF FORMING A DRIVER BOARD ASSEMBLY

(71) Applicants: Toyota Motor Engineering & Manufacturing North America, Inc., Plano, TX (US); Toyota Jidosha Kabushiki Kaisha, Toyota (JP)

(72) Inventors: Feng Zhou, Ann Arbor, MI (US); Hiroshi Ukegawa, Nisshin (JP); Shohei Nagai, Toyota (JP)

(73) Assignees: Toyota Motor Engineering & Manufacturing North America, Inc., Plano, TX (US); Toyota Jidosha Kabushiki Kaisha, Aichi-Ken (JP)

( * ) Notice: Subject to any disclaimer, the term of this patent is extended or adjusted under 35 U.S.C. 154(b) by 0 days.

(21) Appl. No.: 17/119,364

(22) Filed: Dec. 11, 2020

(65) Prior Publication Data

US 2022/0192002 A1    Jun. 16, 2022

(51) Int. Cl.
*H05K 1/02* (2006.01)
*H05K 1/18* (2006.01)
*H05K 3/30* (2006.01)
*H05K 7/20* (2006.01)
*H05K 3/46* (2006.01)

(52) U.S. Cl.
CPC .......... *H05K 1/0206* (2013.01); *H05K 1/182* (2013.01); *H05K 3/30* (2013.01); *H05K 3/46* (2013.01); *H05K 7/205* (2013.01); *H05K 7/20509* (2013.01)

(58) Field of Classification Search
CPC ............................ H05K 1/0206; H05K 1/182
See application file for complete search history.

(56) References Cited

U.S. PATENT DOCUMENTS 4,884,168 A    11/1989  August et al.
5,943,216 A *   8/1999  Schmidt ................ H05K 1/182
                                                    361/764

(Continued)

FOREIGN PATENT DOCUMENTS

CN      110430739 A    11/2019
DE      19532922 A1     3/1997
(Continued)

*Primary Examiner* — Mukundbhai G Patel
(74) *Attorney, Agent, or Firm* — Dinsmore & Shohl LLP (57) ABSTRACT

A circuit board assembly includes a printed circuit board (PCB) substrate, a cooling assembly, an intermediate layer, one or more power devices, and a plurality of conductive layers arranged within the PCB substrate. The PCB substrate has a first surface and an opposite second surface that has a first electrical pattern. The cooling assembly is thermally coupled to the second surface of the PCB substrate. The intermediate layer is sandwiched between the PCB substrate and the cooling assembly. The one or more power devices are embedded within the PCB substrate. The plurality of conductive layers are configured to electrically couple the one or more power devices and thermally couple the one or more power devices to the cooling assembly. At least a portion of the intermediate layer has a second electrical pattern that is similarly patterned to the first electrical pattern of the second surface of the PCB substrate.

20 Claims, 6 Drawing Sheets

(56) References Cited

U.S. PATENT DOCUMENTS

| | | | |
|---|---|---|---|
| 6,373,705 B1 | 4/2002 | Koelle et al. | |
| 9,888,568 B2* | 2/2018 | Parker | H05K 13/0465 |
| 10,117,321 B2 | 10/2018 | Kahrimanovic | |
| 10,622,331 B2 | 4/2020 | Hinrich et al. | |
| 2003/0121643 A1* | 7/2003 | Connors | F28D 15/0266 |
| | | | 165/80.3 |
| 2005/0017740 A1* | 1/2005 | Higashitani | H05K 1/186 |
| | | | 361/728 |
| 2006/0291173 A1* | 12/2006 | Cho | H01L 24/97 |
| | | | 361/783 |
| 2014/0268574 A1* | 9/2014 | Itoi | H01L 24/19 |
| | | | 29/830 |
| 2016/0270227 A1* | 9/2016 | Wu | H05K 1/0204 |
| 2020/0335416 A1* | 10/2020 | Yamasaki | B22F 1/0074 |

FOREIGN PATENT DOCUMENTS

| | | |
|---|---|---|
| DE | 102016223477 A1 | 5/2018 |
| WO | 2018178140 A1 | 10/2018 |

\* cited by examiner

DRIVER BOARD ASSEMBLIES AND METHODS OF FORMING A DRIVER BOARD ASSEMBLY

TECHNICAL FIELD

The present specification generally relates to driver board assemblies and methods of forming a driver board assembly and, more specifically, driver board assemblies and methods of forming a driver board assembly including power devices embedded within a PCB substrate and providing an intermediate layer between the PCB substrate and a cooling assembly mounted to the PCB substrate to eliminate insulation and/or grease layers.

BACKGROUND

A power control unit (PCU) may be used in motor-drive hybrid and electric vehicles. PCUs may include power devices arranged in inverter and/or converter topologies, which are packaged in a plurality of power cartridges and which may be individually connected to a driver board. For more compact and higher power-density, power devices are embedded into the driver board, such as within a multilayer printed circuit board (PCB). The multilayer PCB has prepreg layers and copper layers laminated to a single piece. However, using resin as the insulation layer of the multilayer PCB leads to high thermal resistance of the multilayer PCB, which results in high temperature differential from the power device to a cooling assembly. This, in turn, limits the multilayer PCB to lower power applications. For high power applications, the electrical insulation layer needs to have high thermal conductivity, such as ceramic. However, a grease layer is needed at least between the multilayer PCB and the cooling assembly. Again, however, the device temperature increases rapidly as the grease layer thickness increases because the heat generated by the power devices is not effectively spread in the multilayer PCB. As such, a need for alternative insulation strategies is needed.

SUMMARY

In one aspect, a circuit board assembly is provided. The circuit board assembly includes a printed circuit board (PCB) substrate, a cooling assembly, an intermediate layer, one or more power devices, and a plurality of conductive layers arranged within the PCB substrate. The PCB substrate has a first surface and an opposite second surface. The second surface has a first electrical pattern. The cooling assembly is thermally coupled to the second surface of the PCB substrate. The intermediate layer is sandwiched between the second surface of the PCB substrate and the cooling assembly. The one or more power devices are embedded within the PCB substrate between the first surface and the second surface. The plurality of conductive layers are arranged within the PCB substrate. The plurality of conductive layers are configured to electrically couple the one or more power devices and thermally couple the one or more power devices to the cooling assembly. At least a portion of the intermediate layer has a second electrical pattern that is similarly patterned to the first electrical pattern of the second surface of the PCB substrate.

In another aspect, a circuit board assembly is provided. The circuit board assembly includes a printed circuit board (PCB) substrate, a cooling assembly, a second substrate, one or more power devices, and a plurality of conductive layers arranged within the PCB substrate. The PCB substrate has a first surface and an opposite second surface. The second surface has a first electrical pattern. The cooling assembly is thermally coupled to the second surface of the PCB substrate. The second substrate is sandwiched between the second surface of the PCB substrate and the cooling assembly. The second substrate has an upper substrate surface and an opposite lower substrate surface. The upper substrate surface has a first conductive layer. The first conductive layer has a first thickness. The lower substrate surface has a second conductive layer. The second conductive layer has a second thickness. The second thickness is greater than the first thickness. The one or more power devices are embedded within the PCB substrate between the first surface and the second surface. The plurality of conductive layers are arranged within the PCB substrate. The plurality of conductive layers are configured to electrically couple the one or more power devices and thermally couple the one or more power devices to the cooling assembly. At least a portion of the intermediate layer has a second electrical pattern that is similarly patterned to the first electrical pattern of the second surface of the PCB substrate.

In yet another aspect, a method of forming a circuit board assembly is provided. The method includes arranging one or more power devices between a first surface and an opposite second surface of a printed circuit board (PCB) substrate and arranging a plurality of conductive layers within the PCB substrate. The plurality of conductive layers are configured to electrically couple the one or more power devices and thermally couple the one or more power devices to a cooling assembly. The method continues by arranging an intermediate layer sandwiched between the second surface of the PCB substrate and the cooling assembly and arranging the cooling assembly to couple to the intermediate layer and thermally couple to the second surface of the PCB substrate. The intermediate layer has a first electrical pattern that is similarly patterned to a second electrical pattern of the second surface of the PCB substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to circuit board assemblies, such as driver board assemblies and methods of forming a driver board assembly. In the embodiments described herein driver board assemblies include a PCB (printed circuit board) substrate. The PCB substrate may include one or more embedded power devices and a plurality of conductive layers that together provide both electrical conduction and thermal conduction. In particular, the plurality of conductive layers provide thermal paths for directing heat to one or more cooling assemblies, which may be mounted to the PCB substrate. An intermediate layer is sandwiched between the PCB substrate and the one or more cooling assemblies. The intermediate layer has a similar conductive layer architecture of a current source as the pattern of the PCB substrate.

In some aspects, the intermediate layer is a direct bonded copper layer. The direct bonded copper layer and the cold plate are mounted via silver sinter. In other aspects, the intermediate layer is a ceramic layer. In this aspect, an upper solder paste is positioned between the PCB substrate and the ceramic layer, a lower solder paste is positioned between the ceramic layer and the one or more cooling assemblies, and a solder layer is positioned between the upper solder paste and the lower solder paste to mount the ceramic layer to the one or more cooling assemblies. In yet another aspect, a second substrate is sandwiched between the PCB substrate and the one or more cooling assemblies. The second substrate includes an upper substrate surface that has a first conductive layer with a first thickness. The second substrate includes a lower substrate surface that has a second conductive layer with a second thickness. The second thickness is greater than the first thickness. The first conductive layer has a similar conductive layer architecture of a current source as the pattern of the PCB substrate.

By integrating the intermediate layer or the second substrate, the need for an insulation layer and/or a grease layer between the PCB substrate and the one or more cooling assemblies is eliminated. Further, the plurality of conductive layers is reduced such that a more compact, power dense driver board may be achieved. Embodiments as provided herein provide numerous advantages including better thermal conductivity (i.e., less of a thermal resistance) between the PCB substrate and the one or more cooling assemblies.

Moreover, embodiments of the present disclosure are able to operate under high power (e.g., 40+ KW) environments, thereby providing greater range of uses. Various embodiments of driver board assembly and methods of manufacture will be described in more detail herein.

Conventional motor drive systems in electrified vehicles (e.g., hybrid electrical vehicles, plug-in hybrid electric vehicles, fuel cell vehicle, and electric vehicles) may include a motor and a power control unit (PCU) that supplies current to the motor from a current source (e.g., a battery). Accordingly, the PCU may include any number of components and/or modules that may allow the PCU to control current supplied to the motor (or other vehicle electronic). In particular, the PCU may include a driver board assembly. However, and as noted above, conventional PCUs may include power devices which are packaged in power cartridges which may be connected to a driver board. The power cartridges may be sandwiched in a liquid cooler to maintain a particular temperature while the power devices are switched on/off, which generates heat. These cartridges and cooling assemblies may have larger volume profiles and/or result in increased electrical inductance.

Embodiments of the present disclosure are directed to assemblies providing lower volume profiles and/or reduced electrical inductance. Moreover, embodiments of the present disclosure allow for operation of high power devices (for example, greater than or equal to 40 kW, 50 kW, 60 kW, 70 kW, 80 kW, 90 kW, 100 kW, 110 kW, 120 kW, 130 kW, 140 kW, or 150 kW) that operate under high temperatures (for example, in excess of 100° C., 150° C., 175° C., 200° C., 225° C., or 250° C.), which generate a large amount of heat that must be removed for the continued operation of the PCU. In particular, the embedded cooling pathways, as will be described in greater detail below, allow for efficient conduction of heat from one or more power devices to prevent overheating, damage, or the like.

Figure 1:
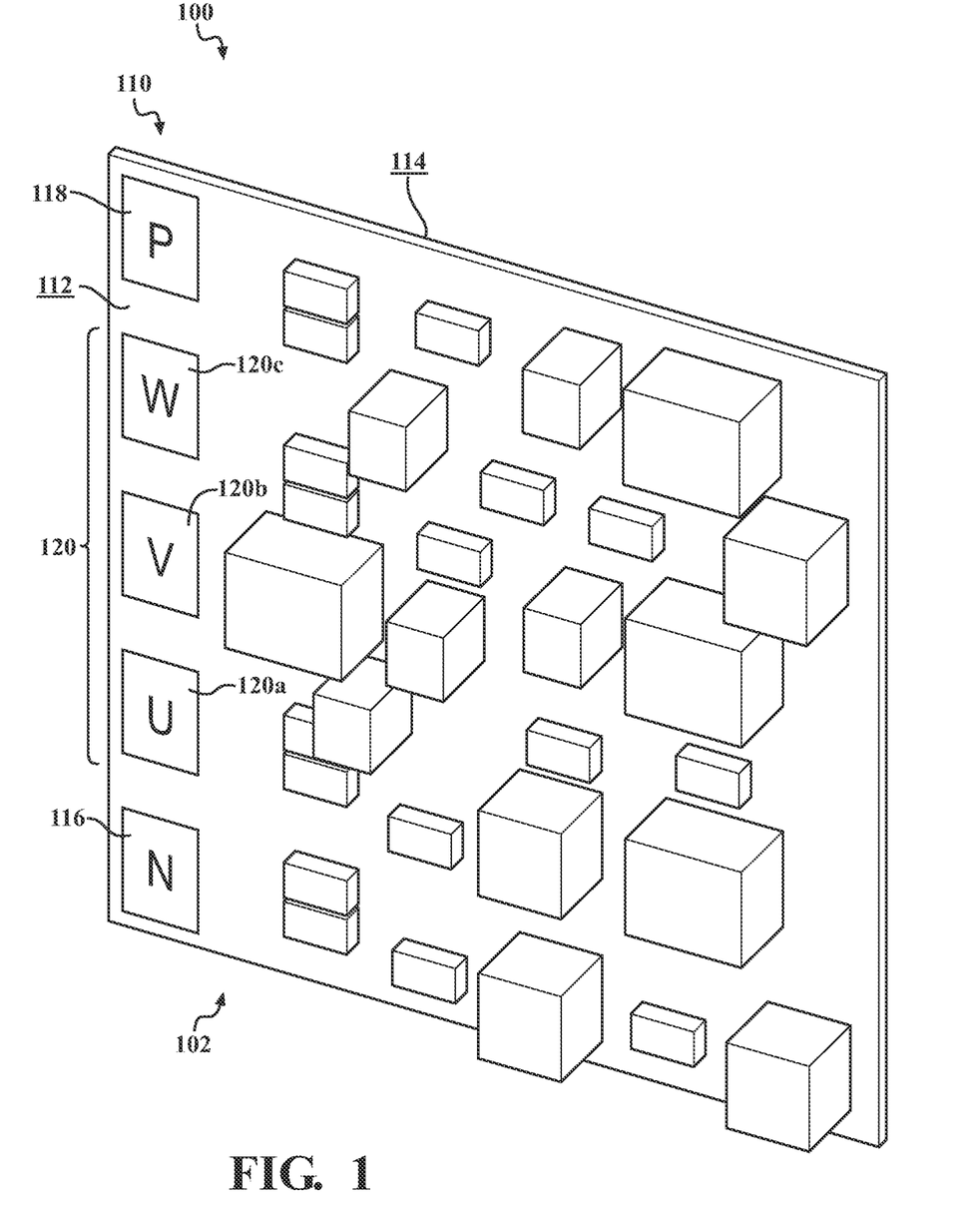
FIG. 1 schematically depicts a driver board assembly, according to one or more embodiments shown and described herein.

Referring now to FIG. 1, an embodiment of a circuit board assembly 100, such as a driver board assembly 100, is generally depicted. The driver board assembly 100 may generally include a PCB substrate 110 comprising a first surface 112 and a second surface 114 opposite and parallel to the first surface 112. Mounted to the first and/or second surface 112, 114 of the PCB substrate 110 may be a one or more of passive components and/or electrical components 102, such as logic circuits, which allow the driver board assembly 100 to function as a gate driver, for example. The one or more passive components and/or electrical components 102 may include one or more resistors, capacitors, inductors, diodes, oscillators, transistors, integrated circuits, switches, terminals, or the like. The first surface 112 or the second surface 114 may also include one or more terminals for connection to one or more devices as will be described in greater detail herein.

For example, the one or more terminals may include a plurality of power terminals including a N-terminal 116, one or more O-terminals 120 (e.g., U-terminal 120a, V-terminal 120b, and W-terminal 120c), and a P-terminal 118 configured electrically couple the driver board assembly 100 to one or more devices (not shown). As will be described below, the driver board assembly 100 may be operable to convert a type of current from a first current to a second current (e.g., AC to DC, DC to AC, or the like). In some embodiments, it is contemplated that the driver board assembly 100 may instead be arranged to convert a first voltage to a second voltage. Accordingly, the driver board assembly 100 may be arranged in a converter topology, an inverter topology, or the like.

Figure 2:
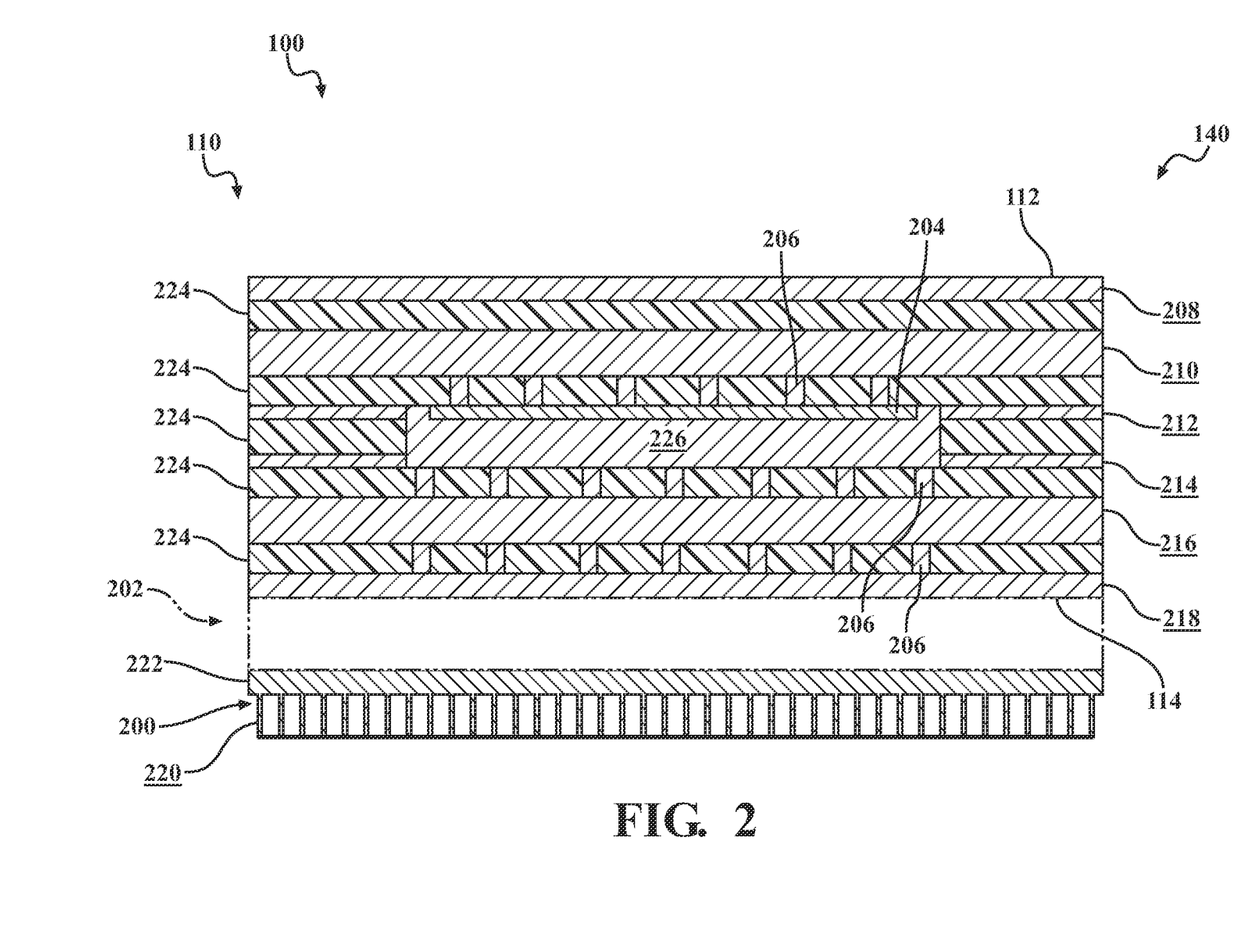
FIG. 2 schematically depicts a cross sectional view of an example driver board assembly such as the driver board assembly of FIG. 1, according to one or more embodiments shown and described herein.

FIG. 2 schematically illustrates a cross-section of the PCB substrate 110 mounted to one or more cooling assemblies 200 and without the plurality of passive components and/or electrical components 102, illustrated in FIG. 1. As illustrated in FIG. 2, the PCB substrate includes a first surface 112 and an opposite second surface 114. The one or more cooling assemblies 200 may be mounted to the second surface 114 of the PCB substrate 110 via an intermediate layer 202. That is, the intermediate layer 202 is positioned or sandwiched between the one or more cooling assemblies 200 and the second surface 114 of the PCB substrate 110 so to thermally couple the one or more cooling assemblies 200 to the PCB substrate 110, as discussed in greater detail herein. It should be appreciated that the intermediate layer 202 may be a direct bonded copper layer 402 (FIG. 4), a ceramic layer 502 (FIG. 5), or substrate 602 (FIG. 6) such as a direct bonded aluminum substrate, an insulated metal substrate, and/or the like, as discussed in greater detail herein.

Further, as will be described in greater detail herein and as schematically illustrated in FIG. 2, a plurality of conductive layers 140 arranged within the PCB substrate 110 thermally couples one or more power devices 204 embedded within the PCB substrate 110 to the one or more cooling assemblies 200, such that the one or more cooling assemblies 200 may provide cooling to the one or more power devices 204 by drawing heat away from the one or more power devices 204 via a plurality of vias 206.

As noted above, the PCB substrate 110 may include the plurality of conductive layers 140 that provide both electrical and thermal conduction through the PCB substrate 110. Accordingly, the PCB substrate 110 may include a logic layer 208 disposed between the first surface of the PCB substrate 110 and a first power layer 210. A first core layer 212 is disposed between the first power layer 210 and a second core layer 214. A second power layer 216 is disposed between the second core layer 214 and a lower layer 218. In some embodiments, a copper substrate S-cell 226 is positioned at the one or more power devices 204. Each of the plurality of conductive layers 140 of the PCB substrate 110 may be a conductive material (both electrical and thermal) such as copper. In other embodiments, the conductive material may be aluminum, silver, nickel, gold, any combination thereof, or the like. Further, the plurality of conductive layers 140 of the PCB substrate 110 may be etched to form various conductive pathways laminated onto and/or between sheets/layers of non-conductive substrates (e.g., dielectric polymer layers) to form an integral and such that the PCB substrate 110 is uniformly thick. PCB substrates according to the present disclosure include a plurality of layers laminated together around the one or more power devices 204 such that the one or more power devices 204 are completely encased within the PCB substrate 110 (such as illustrated in FIG. 2). The plurality of conductive layers 140, as noted above, provide both electrical conduction to and from the one or more power devices 204 and thermal conductive between the one or more power devices 204 and the one or more cooling assemblies 200.

The intermediate layer 202 is coupled to the lower layer 218 and the one or more cooling assemblies 200, by various applications, as discussed in greater detail herein. It should be appreciated that the intermediate layer 202 and/or the lower layer 218 electrically isolate electricity from one or more components of the one or more cooling assemblies 200, as discussed in greater detail herein.

In embodiments, one or more PCB material layers 224 may interface between each layer of the PCB substrate 110. That is, one or more PCB material layers 224 may be positioned between each one of the layers of the PCB substrate 110 and between the first surface 112 and the second surface 114 (e.g., between the logic layer 208 and the first power layer 210, between the first power layer 210 and the first core layer 212, between the first core layer 212 and the second core layer 214, and between the second core layer 214 and the lower layer 218). The intermediate layer 202 is coupled to the lower layer 218. Each of the one or more PCB material layers 224 provide both electrical and thermal conduction through the PCB substrate 110. Further, in some embodiments, the one or more PCB material layers 224 may include pre-preg material. As such, the PCB material layers 224 and the plurality of conductive layers 140 of the PCB substrate 110 may be laminated together.

As discussed in greater detail herein, the intermediate layer 202 may reduce thermal resistance and/or increase thermal conductivity by implementing a better thermal conductivity (i.e., less of a thermal resistance) between the PCB substrate 110 and the one or more cooling assemblies 200. Further, it should be appreciated that the PCB substrate 110 does not include an electrical insulation layers and/or grease layers such as those found in conventional PCB substrates. Moreover, embodiments of the present disclosure are able to operate under high power (e.g., 40+ KW) environments, thereby providing greater range of uses.

The one or more cooling assemblies 200 may include any device or combination of devices that remove heat generated by the one or more power devices 204. In some embodiments, the one or more cooling assemblies 200 may include the plurality of vias 206 and/or a cold plate 220 with an upper layer 222 positioned to make contact with the cold plate 220 and the intermediate layer 202. In some embodiments, the cold plate 220 may include a plurality of fins and be configured to thermally cool the PCB substrate 110. This may be via liquid cooling or heat sink cooling. Further, in some embodiments, the plurality of vias 206 assist in the thermal conductivity of coupling the PCB substrate 110 to the cold plate 220 by directing undesirable heat to the cold plate 220.

In some embodiments, the upper layer 222 may be formed with silver plated aluminum. In other embodiments, the upper layer 222 may be formed with gold, copper, and the like. It is also noted that the one or more cooling assemblies 200 may include a greater or fewer number of components without departing from the scope of the present disclosure. The plurality of vias 206 may extend vertically (i.e., in a Z direction) through a particular number of layers of the one or more PCB material layers 224 of the PCB substrate 110. As such, in some embodiments, each of the plurality of vias 206 may be formed from a thermally conductive material, such as copper. In other embodiments, the conductive material of the plurality of vias 206 may be formed from aluminum, silver, nickel, gold, any combination thereof, or the like.

The cold plate 220 may thermally couple to the PCB substrate 110 and the plurality of conductive layers 140 thereof. The cold plate 220 may be coupled to the intermediate layer 202, as discussed in greater detail herein. As such, the cold plate 220 may draw heat through the plurality of vias 206 from the one or more power devices 204 along the plurality of conductive layers 140. The cold plate 220 may include one or more channels formed therein which allow for coolant fluid to be circulated through the cold plate 220 to draw heat away from the cold plate 220. In some embodiments, the cold plate 220 may include a plurality of fins past which coolant fluid may flow to draw heat from the cold plate 220.

In some embodiments, another electronic device, such as a capacitor for storing electrical energy may be mounted to the one or more cooling assemblies 200 opposite the PCB substrate 110. The operation of the capacitor may also generate heat. Accordingly, the cold plate 220 may be in thermal communication with the capacitor (e.g., mounted to the capacitor) such that the one or more cooling assemblies 200 may cool the capacitor as it simultaneously cools the one or more power devices 204. The capacitor may be mounted to the one or more cooling assemblies 200 via a plurality of fasteners such as screws, rivets, adhesives, soldering, and the like. However, and as noted above, other coupling techniques are also contemplated and possible. For example, an external housing or cage (not shown) may mount the capacitor to the one or more cooling assemblies 200 and the PCB substrate 110. In some embodiments, there may not be a capacitor mounted to the one or more cooling assemblies 200.

Figure 3:
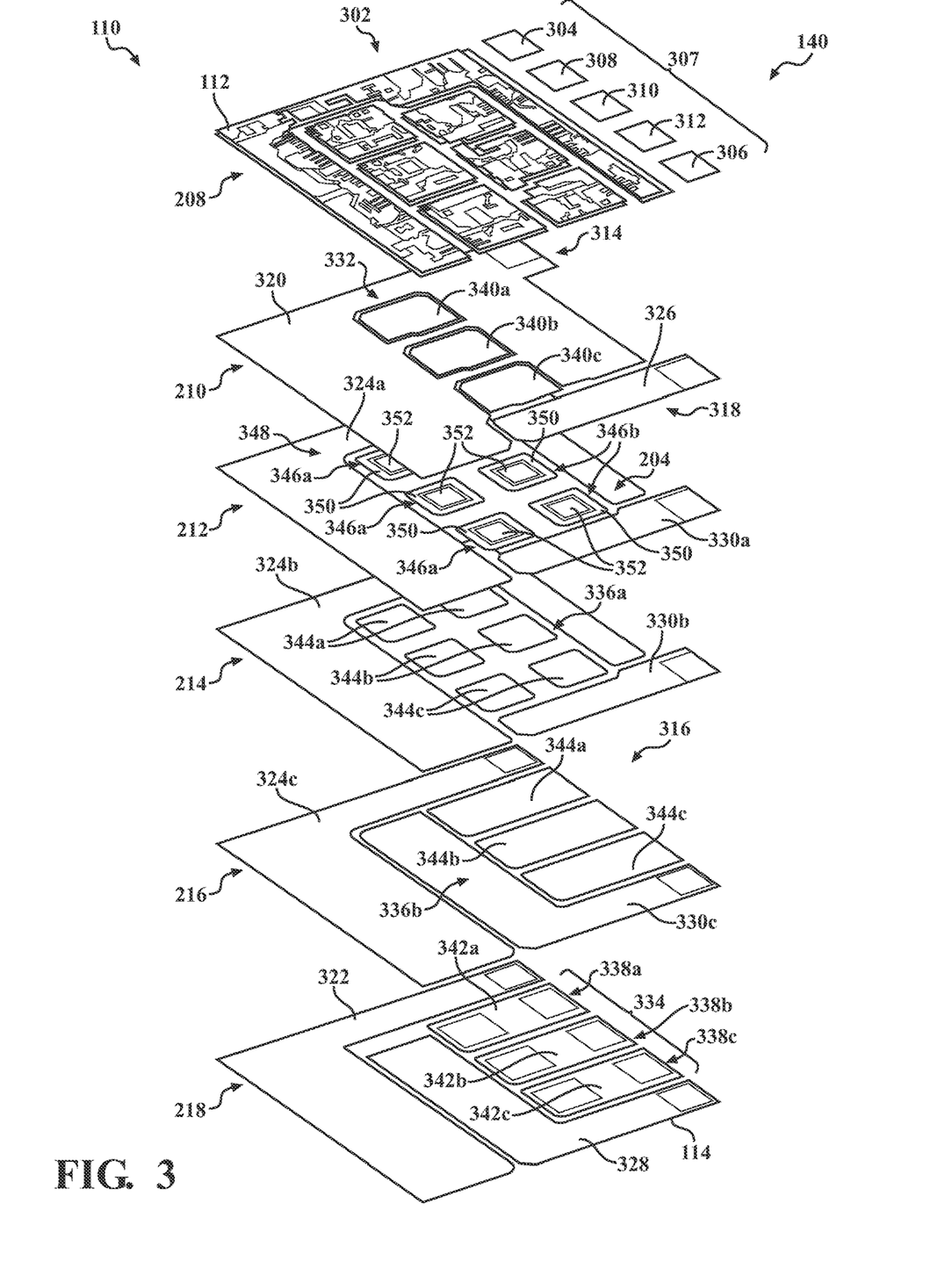
FIG. 3 schematically depicts an exploded view of a plurality of conductive layers embedded within a PCB substrate such as depicted in FIG. 2, according to one or more embodiments shown and described herein.

FIG. 3 schematically illustrates an exploded view of various plurality of layers of the PCB substrate 110 without depicting any of the one or more PCB material layers 224. As discussed herein, the plurality of conductive layers 140 are configured to provide electrical and thermal conduction, as described in further detail below. It is noted that the layout of each layer illustrated is non-limiting as the layer architecture may be modified in a variety of ways, such as described herein, to, for example, provide one of the inverter topology and the converter topology.

As discussed herein, the plurality of conductive layers 140 of the PCB substrate 110 may include the logic layer 208 formed at the uppermost surface of the PCB substrate 110 such that the first surface 112 of the PCB substrate 110 is formed at the logic layer 208. It should also be understood that this is a non-limiting example, and the logic layer 208 may be coupled anywhere on the PCB substrate 110. The logic layer 208 may include any number of ports and/or electric traces 302 for coupling the plurality of passive and/or electrical components 102 and the illustrated in FIG. 1, to one or more power devices 204 and/or to one another. Further, the logic layer 208 may include any number of ports and/or electric traces for each of an N-logic layer architecture 304, a P-logic layer architecture 306 and an O-logic layer architecture 307, which includes a U-logic layer architecture 308, a V-logic layer architecture 310, and a W-logic layer architecture 312. The N-logic layer architecture 304, the P-logic layer architecture 306, and the O-logic layer architecture 307 may each include any number of ports and/or electric traces 302 for electrically coupling the one or more power devices 204 to the N-terminal 116, the one or more O-terminals 120, and the P-terminal 118, as discussed in greater detail herein.

The remaining plurality of conductive layers 140 (i.e., the first power layer 210, the first core layer 212, the second core layer 214, the second power layer 216 and the lower layer 218) may provide one or more electrical and thermal conduction architectures. The plurality of conductive layers 140 may provide a first conductive layer architecture including a plurality of layers, a second conductive layer architecture including a plurality of layers, a third conductive layer architecture including a plurality of layers, or the like. For example, the plurality of conductive layers 140 may define an N-conductive layer architecture 314, an O-conductive layer architecture 316, and a P-conductive layer architecture 318, which electrically couples the one or more power devices 204 to the N-terminal 116, the one or more O-terminals 120, and the P-terminal 118, illustrated in FIG. 1. The N-conductive layer architecture 314, O-conductive layer architecture 316, and P-conductive layer architecture 318 refer to electrical circuit architecture such as in an inverter or converter topology. For example, the N-conductive layer architecture 314 may electrically couple the one or more power devices 204 to a current source (for example, a battery), the O-conductive layer architecture 316 may output an inverted or converted current signal (e.g., AC instead of DC), and the P-conductive layer architecture 318 may complete the circuit by coupling the one or more power devices 204 back to the current source.

As noted herein and further described below, the N-conductive layer architecture 314, the O-conductive layer architecture 316, and the P-conductive layer architecture 318 also provide thermal management to the one or more power devices 204 by providing thermally conductive pathways to deliver heat generated by operation (e.g., switching on/off) of the one or more power devices 204 to the one or more cooling assemblies 200 thereby cooling to one or more power devices 204. It is noted, for clarity, that each of the N-conductive layer architecture 314, O-conductive layer architecture 316, and P-conductive layer architecture 318 are separate and distinct from one another to allow for operation of the driver board assembly 100 in the one of the converter and/or inverter topology.

Still referring to FIG. 3, the N-conductive layer architecture 314 may include a plurality of electrically and thermally conductive N-layers including a top N-layer 320, a bottom N-layer 322, and a plurality of intermediate N-layers (e.g., N-layers 324a, 324b, 324c). It should be understood that in the embodiments described herein, there are three of the plurality of intermediate N-layers. This is non-limiting and there may be more or fewer of intermediate N-layers between the top N-layer 320 and the bottom N-layer 322 (e.g., one or more N-layers, two or more N-layers, three or more N-layers, four or more N-layers, and the like) When laminated together in the PCB substrate 110, each of the N-layers may be electrically and thermally coupled to one another. For example, the plurality of N-layers may be in contact with another (e.g., either directly contacted such as in a face to face relationship with one another or in contact through a plurality of vias 206 such as those illustrated in FIG. 2. In some embodiments, each layer of the plurality of conductive layers 140 may include an N-layer. In some embodiments, only some of the conductive layers 140 may include an N-layer. The N-conductive layer architecture 314 is connected to and/or defines the N-terminal 116 as noted above.

Referring still to FIG. 3, the P-conductive layer architecture 318 may include a plurality of P-layers including a top P-layer 326, a bottom P-layer 328, and a plurality of intermediate P-layers (e.g., P-layer 330a, 330b, 330c). It should be understood that in the embodiments described herein, there are three of the plurality of intermediate P-layers. This is non-limiting and there may be more or fewer of intermediate P-layers between the top P-layer 326 and the bottom P-layer 328 (e.g., one or more P-layers, two or more P-layers, three or more P-layers, four or more P-layers, and the like). When laminated together in the PCB substrate 110, each of the P-layers may be electrically and thermally coupled to one another. For example, the plurality of P-layers may be in contact with another (e.g., either directly contacted with one another or in contact through the plurality of vias 206, as illustrated in FIG. 2. In some embodiments, each layer of the plurality of conductive layers 140 may include a P-layer. In some embodiments, only some of the conductive layers 140 may include a P-layer. The P-conductive layer architecture 318 is connected to and/or defines the P-terminal 118 as noted above.

Referring still to FIG. 3, the O-conductive layer architecture 316 may include a plurality of O-layers including one or more top O-layers 332, one or more bottom O-layers 334, and a plurality of intermediate O-layers (e.g., intermediate O-layer 336a, 336b). There may be any number of intermediate O-layers between the one or more top O-layers 332 and the one or more bottom O-layers 334. (e.g., one or more O-layers, two or more O-layers, four or more O-layers, etc.).

When arranged in an inverter topology, the O-conductive layer architecture 316 may include U-conductive layer architecture 338a, a V-conductive layer architecture 338b, and a W-conductive layer architecture 338c. For example, the U-conductive layer architecture 338a, the V-conductive layer architecture 338b, and the W-conductive layer architecture 338c may be configured to output one of each phase of an alternating current (i.e., the U-phase, V-phase, and W-phase) to provide an alternating current to, for example, an electric motor. As illustrated the U-conductive layer architecture 338a, V-conductive layer architecture 338b, and W-conductive layer architecture 338c may be substantially identical to one another and positioned parallel to one another.

The one or more top O-layers 332 may include a top U-layer 340a, a top V-layer 340b, and a top W-layer 340c. Similarly, the one or more bottom O-layers 334 include a bottom U-layer 342a, a bottom V-layer 342b, and a bottom W-layer 342c. Additionally, each of the plurality of intermediate O-layers includes an intermediate U-layer 344a, an intermediate V-layer 344b, and an intermediate W-layer 344c. Each of the intermediate U-layer 344a, intermediate V-layer 344b, and intermediate W-layer 344c may include any number of layers (e.g., one or more layers, two or more layers, three or more layers, four or more layers, and the like). When laminated together in the PCB substrate 110, each of the U-layers may be electrically and thermally coupled to one another, each of the V-layers may be electrically and thermally coupled to one another, and each of the W-layers may be electrically and thermally coupled to one another. For example, each layer of the O-conductive layer architecture 316 (i.e., each layer of the U-conductive layer architecture 338a, each layer of the V-conductive layer architecture 338b, and each layer of the W-conductive layer architecture 338c) may by in contact with one another (e.g., either directly contacted with one another or in contact through the plurality of vias 206 such as those illustrated in FIG. 2. In some embodiments, each layer of the plurality of conductive layers 140 may include an O-layer. In some embodiments, only some of the conductive layers 140 may include an O-layer. The O-conductive layer architecture 316 is connected to and/or defines the one or more O-terminals 120. For example, the one or more O-terminals 120 may include a U-terminal 120a (defined by and/or connected to the U-conductive layer architecture 338a), a V-terminal 120b (defined by and/or connected to the V-conductive layer architecture 338b), and a W-terminal 120c (defined by and/or connected to the W-conductive layer architecture 338c. Additionally, each of the U-conductive layer architecture 338a, V-conductive layer architecture 338b, and W-conductive layer architecture 338c are separate and distinct from one another to allow alternating current to be delivered via the U-conductive layer architecture 338a, V-conductive layer architecture 338b, and W-conductive layer architecture 338c to the corresponding U-terminal 120a, the V-terminal 120b, and the W-terminal 120c.

Still referring to FIG. 3, the one or more power devices 204 may be positioned between the first core layer 212 and the second core layer 214. As such, the upper layers (e.g., the first through the third layers) may provide the topology of an inverter, converter, or the like. The lower layers (e.g., the fourth through six-layer) may provide the additional conductive layers to conduct heat away from the one or more power devices 204 to the second surface 114 of the PCB substrate 110 and may include similar footprint areas for each of the N-conductive layer architecture 314, O-conductive layer architecture 316, and P-conductive layer architecture 318 to encourage heat transfer toward the second surface 114 of the PCB substrate 110. However, other configurations are contemplated and possible such as where double side cooling is desired.

Still referring to FIG. 3, the one or more power devices 204 may include a plurality of power devices, which may be arranged in pairs of two power devices including a first power device 346a and a second power device 346b. As will be described herein, the one or more power devices 204 may include switching devices which may be operated in such a manner as to convert a direct current to an alternating current. However, it is contemplated that assemblies as described herein may be assembled in a converter topology to convert an alternating current to a direct current, of perform some other conversion from a first current type to a second current type. It is noted that the following-description generally focuses inverter topologies though other topologies are contemplated and possible.

The one or more power devices 204 may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the one or more power devices 204 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the one or more power devices 204 operate at high current and under high temperatures, for example in excess of 250° C. and generate a large amount of heat that must be removed for the continued operation of the example driver board assembly 100. The one or more power devices 204 may be controlled by the gate drive device (not shown) in the PCB substrate 110 to change a current type between an alternating current to a direct current, for example.

Each of the power devices 204 may be part of a power device assemblies 348 such that embedded within the PCB substrate 110 are one or more power device assemblies 348 each comprising a conductive substrate 350 and a power device 352 embedded within the conductive substrate 350 (e.g., formed from copper, aluminum, zinc, or the like). In some embodiments, a cavity may be formed within the conductive substrate 350 and the power device 352 may be positioned within the cavity and bonded to the conductive substrate 350 (e.g., any conventional bonding techniques such as sintering, soldering, or the like may be used). The one or more power devices 204 may then be embedded within the PCB substrate 110 such that the various conductive layer architectures couple to the one or more power devices 204 (or power device assemblies 348) to achieve the particular topology (e.g., inverter topology, converter topology, or the like). For example, the one or more power device assemblies 348 may include a plurality of power devices 204, which may be arranged in pairs including the first power device 346a and the second power device 346b. For example, in an inverter topology there may be three pairs of power device assemblies 348. In some embodiments, pairs of power device assemblies may be arranged in a parallel topology. For example, an inverter may include one array of power device assemblies 348 including six power device assemblies thereby providing three pairs of power device assemblies. In a parallel topology, two arrays of six power device assemblies may be provided for a total of twelve power device assemblies. Similarly, there may be more than two layers of power device assemblies 348. For example, in another parallel topology, three arrays of six power device assemblies may be provided for a total of eighteen power device assemblies.

It should be appreciated that the top N-layer 320 couples to each of the first power device 346a, and the top O-layers 332 connects to each of the first and second power devices 346a, 346b. For example, the top U-layer 340a couples to both a first power device 346a and the second power device 346b of a pair of power device assemblies 348, the top V-layer 340b couples to both a first power device 346a and a second power device 346b of a pair of power device assemblies 348, and the top W-layer 340c couples to both of a first power device 346a and a second power device 346b of a pair of power device assemblies 348. As will be described further in embodiments below, the P-conductive layer architecture 318 may connect to another surface of the second power device assemblies 348.

Still referring to FIG. 3, it should be appreciated that each of the bottom N-layer 322, bottom O-layers 334 (including the bottom U-layer 342a, the bottom V-layer 342b, and the bottom W-layer 342c), and bottom P-layer 328, are exposed on the second surface 114, which may be attached the one or more cooling assemblies 200 via the intermediate layer 202, described above, to allow heat transfer through the PCB substrate 110 via the plurality of conductive layers 140 away from the one or more power devices 204 and/or power device assemblies 348.

As noted above, in an inverter assembly, the N-terminal 116 may be connected to a current source (e.g., a battery) configured to output a first current type (e.g., a direct current). Accordingly, the N-terminal 116 may be electrically coupled to a positive terminal of the current source and the P-terminal 118 may be connected to a negative terminal of the current source. The one or more O-terminals 120 may be configured to output a second current type, different from the first current type, such that the first current type is converted to the second current type. For example, each pair of power devices 204 may be configured to output one of each phase of an alternating current (i.e., the U-phase, V-phase, and W-phase) to provide an alternating current to, for example, an electric motor.

Figure 4A:
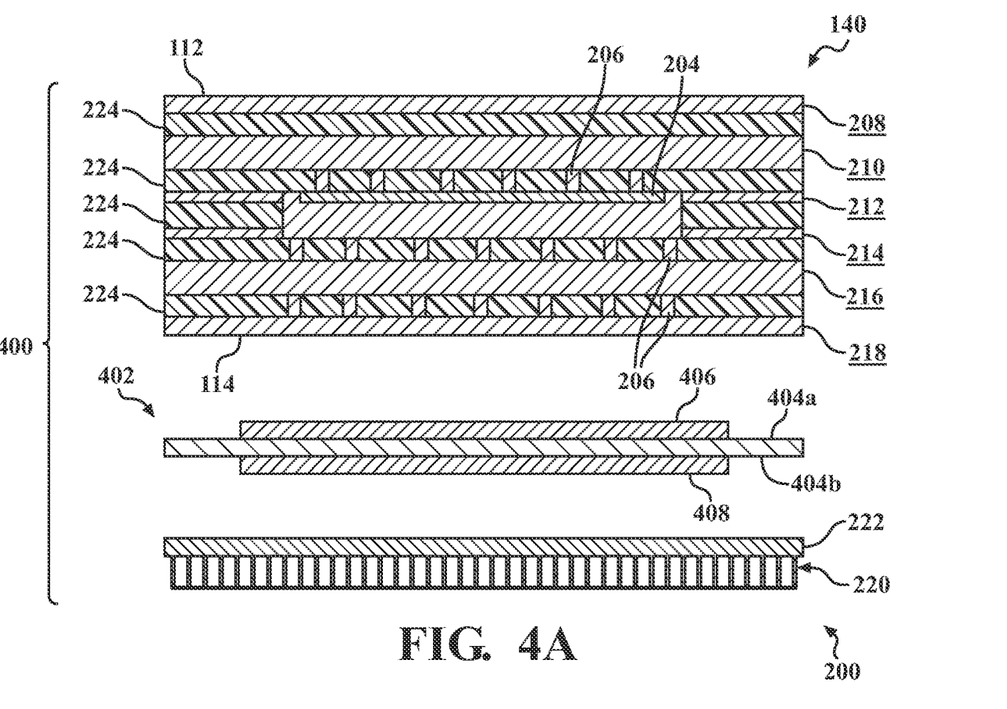
FIG. 4A schematically depicts a cross-section of a partially exploded PCB substrate of FIG. 2 including a direct bonded copper layer positioned between a PCB substrate and one or more cooling assemblies, according to one or more embodiments shown and described herein.

Now referring to FIG. 4A, a cross-sectional view of the PCB substrate 110, intermediate layer 202 and one or more cooling assemblies 200 partially exploded is schematically depicted as a driver board assembly 400. It should be appreciated that the PCB substrate 110 of the driver board assembly 400 is identical to the PCB substrate 110 of the driver board assembly 100 of FIGS. 2 and 3. Therefore, like reference numerals will be used and, for brevity reasons, further description will not be provided.

With respect to the driver board assembly 400, the intermediate layer 202 is a direct bonded copper layer 402. The direct bonded copper layer 402 is sandwiched between the second layer 114 of the PCB substrate 110 and the upper layer 222 of the cold plate 220 so to thermally couple the one or more cooling assemblies 200 to the PCB substrate 110. That is, the direct bonded copper layer 402 includes an upper copper surface 404a and an opposite lower copper surface 404b, an upper bonded portion 406 and an opposite lower bonded portion 408. The upper bonded portion 406 is mounted or coupled to the second layer 114 of the PCB substrate 110 and the lower bonded portion 408 is coupled or mounted to the upper layer 222 of the cold plate 220.

In some embodiments, the upper copper surface 404a and/or the upper bonded portion 406 of the direct bonded copper layer 402 are each patterned similarly to the electrical pattern of the lower layer 218. That is, the upper copper surface 404a and/or the upper bonded portion 406 of the direct bonded copper layer 402 may be patterned similarly to match the bottom N-layer 322, the bottom P-layer 328, the bottom U-layer 342a, the bottom V-layer 342b, and the bottom W-layer 342c of the O-conductive layer architecture 316. The upper copper surface 404a of the direct bonded copper layer 402 is electrically conductive. As such, the matching pattern to the electrical pattern of the lower layer 218 is to avoid short circuiting the copper traces of the plurality of conductive layers 140 of the PCB substrate 110.

It should be appreciated that the lower copper surface 404b of the direct bonded copper layer 402 may be with or without the electrical pattern as necessary. In some embodiments, the upper bonded portion 406 is mounted or coupled to the second layer 114 of the PCB substrate 110 via a plurality of bonding techniques, such as silver sintering, soldering, copper sintering, and the like. Further, in some embodiments, the lower bonded portion 408 is coupled or mounted to the upper layer 222 of the cold plate 220 via a plurality of bonding techniques, such as silver sintering, soldering, copper sintering, and the like. In embodiments, the bonding techniques to bond the upper bonded portion 406 to the second layer 114 of the PCB substrate 110 and the bonding technique to bond the lower bonded portion 408 to the upper layer 222 of the cold plate 220 is the same technique (i.e., both use soldering, silver sintering, copper sintering, and the like). In other embodiments, the bonding technique to bond the upper bonded portion 406 to the second layer 114 of the PCB substrate 110 and the bonding technique to bond the lower bonded portion 408 to the upper layer 222 of the cold plate 220 is a different technique. That is, the technique to bond the upper bonded portion 406 to the second layer 114 of the PCB substrate 110 may be via soldering and the bonding technique to bond the lower bonded portion 408 to the upper layer 222 of the cold plate 220 is via silver sintering, and vice versa or combinations thereof.

Figure 7:
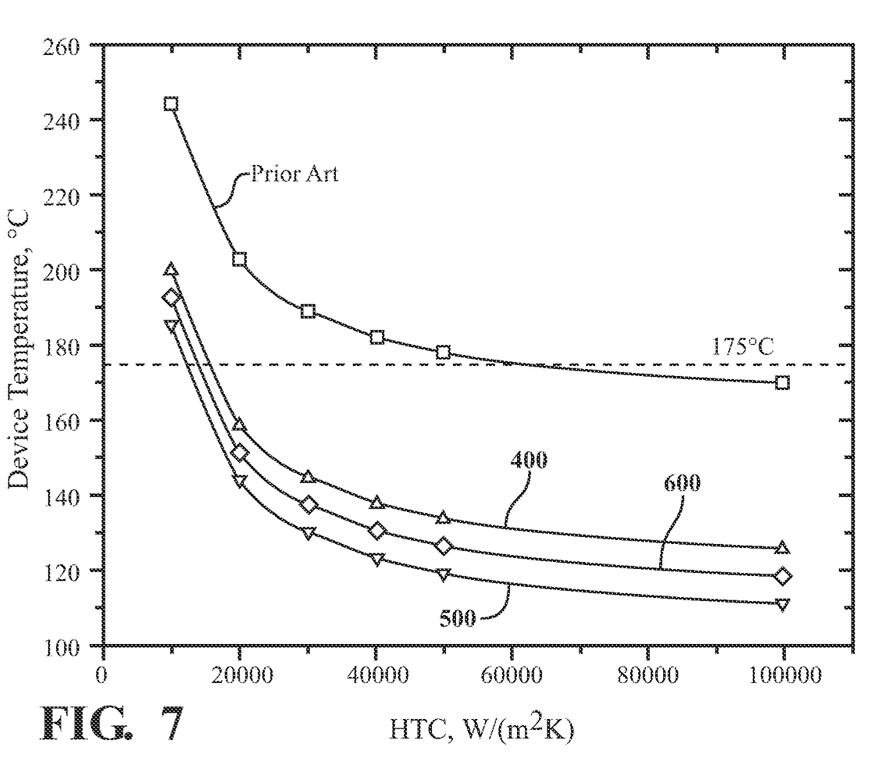
FIG. 7 schematically illustrates a graphical representation of a device temperature as a function of a heat transfer coefficient, according to one or more embodiments shown and described herein.

As such, it should be appreciated that the driver board assembly 400 does not include grease layers or insulation layers. Accordingly, this arrangement decreases the overall thermal resistance with respect to conventional driver board assemblies, as discussed herein with respect to FIG. 7. In other embodiments, the patterns between the upper copper surface 404a and the upper bonded portion 406 of the direct bonded copper layer 402 and the electrical pattern of the lower layer 218 do not match.

Figure 4B:
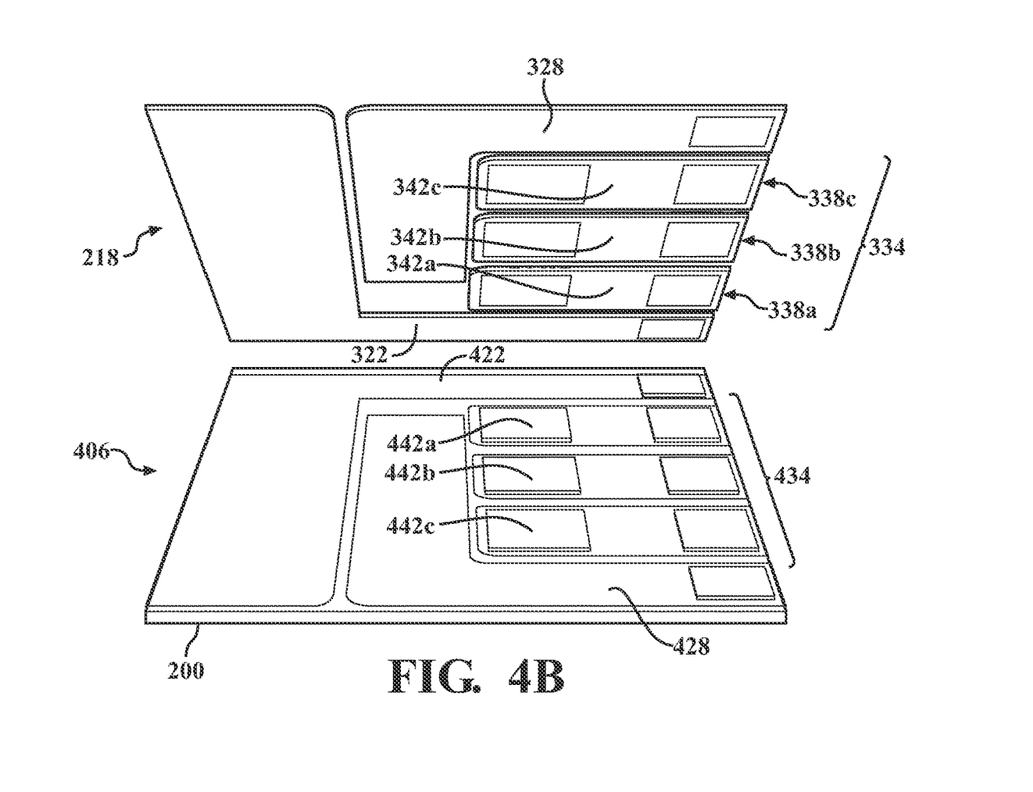
FIG. 4B schematically depicts a partial perspective view of a portion of the direct bonded copper layer of FIG. 4A and a lower layer of the PCB substrate of FIG. 3, according to one or more embodiments shown and described herein.

Now referring to FIG. 4B, a partial perspective view of the upper bonded portion 406 of the direct bonded copper layer 402 and the lower layer 218 is schematically depicted. As illustrated, the upper bonded portion 406 of the direct bonded copper layer 402 and the lower layer 218 are each patterned similarly such that an electrical short circuit is prevented. That is, as discussed above, the electrical pattern of the lower layer 218 includes the bottom N-layer 322, the bottom P-layer 328, the bottom U-layer 342a, the bottom V-layer 342b, and the bottom W-layer 342c of the one or more bottom O-layers 334.

The upper bonded portion 406 of the direct bonded copper layer 402 includes a matched electrical pattern, such as a matched bottom N-layer 422, a matched bottom P-layer 428, a matched bottom U-layer 442a, a matched bottom V-layer 442b, and a matched bottom W-layer 442c of the one or more matched bottom O-layers 434. As such, the electrical patterns of the lower layer 218 and the upper bonded portion 406 of the direct bonded copper layer 402 are mated with similar U, V, W conductive layer architectures and a P and N conductive layer architectures. It should be understood that in some embodiments, the upper copper surface 404a may also be patterned similarly to the electrical pattern of the lower layer 218.

Figure 5:
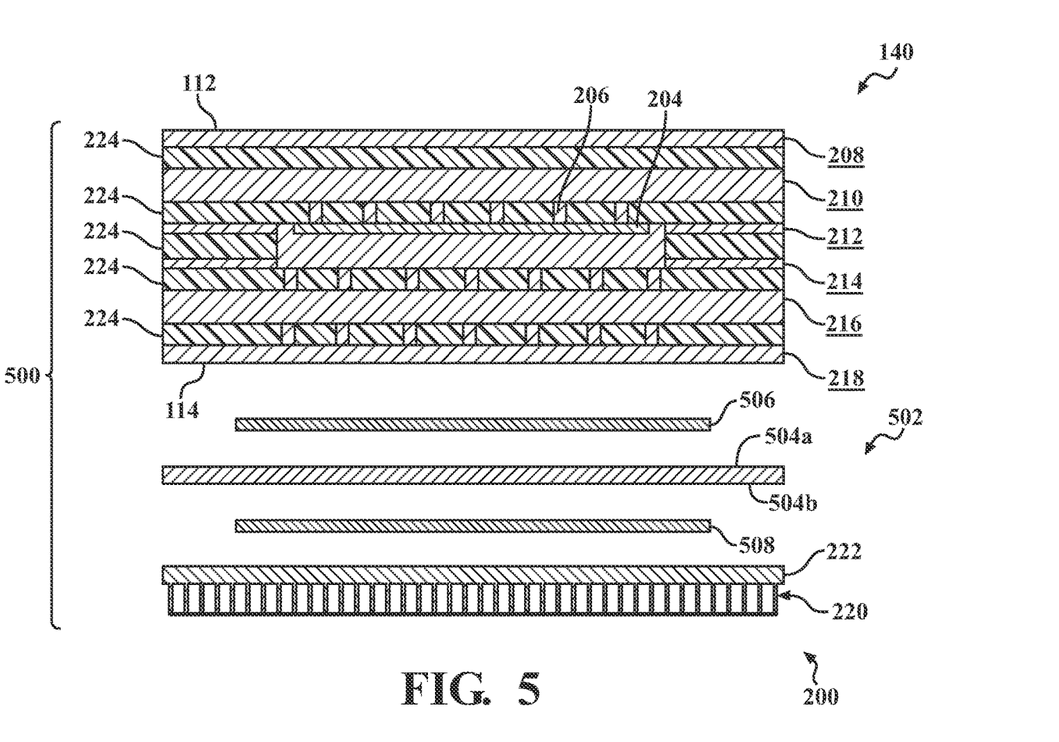
FIG. 5 schematically depicts a cross-section of a partially exploded PCB substrate of FIG. 2 including a ceramic layer positioned between a PCB substrate and one or more cooling assemblies, according to one or more embodiments shown and described herein.

Now referring to FIG. 5, a cross-sectional view of the PCB substrate 110, intermediate layer 202 and one or more cooling assemblies 200 partially exploded is schematically depicted as a driver board assembly 500. It should be appreciated that the PCB substrate 110 of the driver board assembly 500 is identical to the PCB substrate 110 of the driver board assembly 100 of FIGS. 2 and 3. Therefore, like reference numerals will be used and, for brevity reasons, further description will not be provided.

With respect to the driver board assembly 500, the intermediate layer 202 is a ceramic layer 502 sandwiched between the second layer 114 of the PCB substrate 110 and the upper layer 222 of the cold plate 220 so to thermally couple the one or more cooling assemblies 200 to the PCB substrate 110. That is, the ceramic layer 502 includes an upper surface 504a and an opposite lower surface 504b, an upper bonding portion 506 and an opposite lower bonding portion 508. The upper bonding portion 506 is mounted or coupled to the second layer 114 of the PCB substrate 110 and the upper surface 504a of the ceramic layer 502. The lower bonding portion 508 is coupled or mounted to the upper layer 222 of the cold plate 220 and the lower surface 504b of the ceramic layer 502. In some embodiments, the ceramic of the ceramic layer 502 is metalized using gold metallization. In other embodiments, the ceramic of the ceramic layer 502 is metalized using alumina, boron nitride, aluminum nitride, and/or the like.

In some embodiments, the upper surface 504a and/or the upper bonding portion 506 of the ceramic layer 502 are patterned similarly to the electrical pattern of the lower layer 218. That is, the upper surface 504a and/or the upper bonding portion 506 of the ceramic layer 502 may be patterned similarly to match the bottom N-layer 322, the bottom P-layer 328, the bottom U-layer 342a, the bottom V-layer 342b, and the bottom W-layer 342c of the O-conductive layer architecture 316, (similar to that as illustrated in FIG. 4B and discussed above). The upper surface 504a of the ceramic layer 502 is electrically conductive. As such, the matching pattern to the electrical pattern of the lower layer 218 is to avoid short circuiting the copper traces of the plurality of conductive layers 140 of the PCB substrate 110.

It should be appreciated that the lower surface 504b of the ceramic layer 502 may be with or without the electrical pattern as necessary. In some embodiments, the upper bonded portion 406 is a solder paste that mounts or couples the ceramic layer 502 to the second layer 114 of the PCB substrate 110 via a plurality of bonding techniques, such as silver sintering, soldering, copper sintering, and the like. Further, in some embodiments, the lower bonded portion 408 is a solder paste that couples or mounts the ceramic layer 502 to the upper layer 222 of the cold plate 220 via a plurality of bonding techniques, such as silver sintering, soldering, copper sintering, and the like. In embodiments, the bonding techniques to bond the upper bonding portion 506 to the second layer 114 of the PCB substrate 110 and the bonding technique to bond the lower bonding portion 508 to the upper layer 222 of the cold plate 220 is the same technique (i.e., both use soldering, silver sintering, copper sintering, and the like). In other embodiments, the bonding technique to bond the upper bonding portion 506 to the second layer 114 of the PCB substrate 110 and the bonding technique to bond the lower bonding portion 508 to the upper layer 222 of the cold plate 220 is a different technique. That is, the technique to bond the upper bonding portion 506 to the second layer 114 of the PCB substrate 110 may be via soldering and the bonding technique to bond the lower bonding portion 508 to the upper layer 222 of the cold plate 220 is via silver sintering, and vice versa or combinations thereof.

As such, it should be appreciated that the driver board assembly 500 does not include grease layers or insulation layers. Accordingly, this arrangement decreases the overall thermal resistance with respect to conventional driver board assemblies, as discussed herein with respect to FIG. 7. In other embodiments, the patterns between the upper surface 504a and the upper bonding portion 506 of the ceramic layer 502 and the electrical pattern of the lower layer 218 do not match Now referring to FIG. 6, a cross-sectional view of a the PCB substrate 110, intermediate layer 202 and one or more cooling assemblies 200 partially exploded is schematically depicted as a driver board assembly 600. It should be appreciated that the PCB substrate 110 of the driver board assembly 600 is identical to the PCB substrate 110 of the driver board assembly 100 of FIGS. 2 and 3. Therefore, like reference numerals will be used and, for brevity reasons, further description will not be provided.

Figure 6:
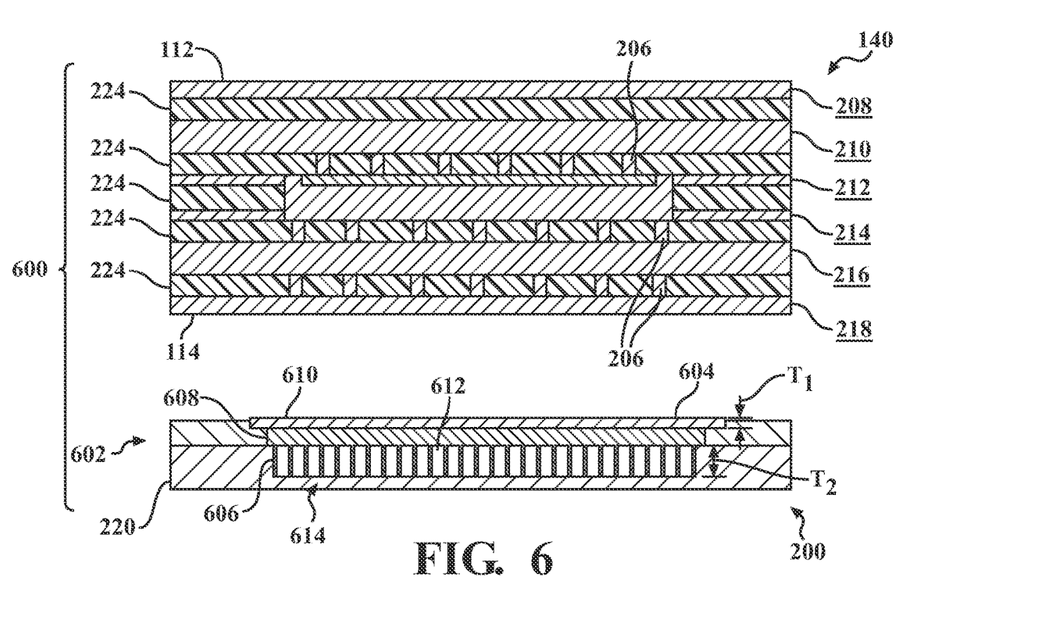
FIG. 6 schematically depicts a cross section of a partially exploded PCB substrate of FIG. 2 including a substrate positioned between a PCB substrate and one or more cooling assemblies, according to one or more embodiments shown and described herein.

With respect to the driver board assembly 600, the intermediate layer 202 is a substrate 602 that is customizable. The substrate 602 may be a direct bonded aluminum substrate or a direct insulated metal substrate and each are configured to thermally couple the one or more cooling assemblies 200 to the PCB substrate 110. That is, the substrate 602 is sandwiched between the second layer 114 of the PCB substrate 110 and, as discussed in greater detail herein, a portion of the substrate 602 is integrated into the cold plate 220, such as by brazing. The substrate 602 includes an upper substrate surface 604 and a spaced apart lower substrate surface 606 that are each separated by a substrate layer 608 such as a ceramic layer. The upper substrate surface 604 incudes a first conductive layer 610, such as a metal. The metal may be a silver, gold, aluminum, and the like. The first conductive layer 610 has a first thickness T1. The lower substrate surface 606 has a second conductive layer 612, such as a metal. The metal may be a silver, gold, aluminum, and the like. The second conductive layer 612 has a second thickness T2. The second thickness T2 is greater than the first thickness T1.

The first conductive layer 610 of the upper substrate surface 604 is mounted or coupled to the second layer 114 of the PCB substrate 110. The second conductive layer 612 of the lower substrate surface 606 is incorporated into the cold plate 220. For example, the lower substrate surface 606 may be machined or otherwise manipulated to form a heat sink structure. In some embodiments, the heat sink structure includes a plurality of fins 614. The cold plate 220 may be manufactured and formed such that the plurality of fins 614 are integrated within the cold plate 220. As such, when the cold plate 220 is manufactured from a metal material, the second conductive layer 612 of the lower substrate surface 606 may be brazed bonded to the cold plate 220. When the cold plate 220 is made of a plastic material, the second conductive layer 612 of the lower substrate surface 606 may be bonded using a plastic-aluminum direct bond. As such, it should be appreciated that the only insulation layer is embedded in the cold plate 220.

In some embodiments, the upper substrate surface 604 and/or the first conductive layer 610 of the substrate 602 are patterned similarly to the electrical pattern of the lower layer 218. That is, the upper substrate surface 604 and/or the first conductive layer 610 of the substrate 602 may be patterned similarly to match the bottom N-layer 322, the bottom P-layer 328, the bottom U-layer 342a, the bottom V-layer 342b, and the bottom W-layer 342c of the O-conductive layer architecture 316 (similar to that as illustrated in FIG. 4B and discussed above). The upper substrate surface 604 and/or the first conductive layer 610 of the substrate 602 is electrically conductive. As such, the matching pattern to the electrical pattern of the lower layer 218 is to avoid short circuiting the copper traces of the plurality of conductive layers 140 of the PCB substrate 110. It should be appreciated that the lower substrate surface 606 and/or the second conductive layer 612 of the substrate 602 may be with or without the electrical pattern as necessary.

In some embodiments, the upper substrate surface 604 and/or the first conductive layer 610 of the substrate 602 is mounted or coupled to the lower surface 114 of the lower layer 218 via a plurality of bonding techniques, such as silver sintering, soldering, copper sintering, and the like. As such, it should be appreciated that the driver board assembly 600 does not include grease layers or insulation layers. Accordingly, this arrangement decreases the overall thermal resistance with respect to conventional driver board assemblies, as discussed herein with respect to FIG. 7. In other embodiments, the patterns between the upper substrate surface 604 and/or the first conductive layer 610 of the substrate 602 and the electrical pattern of the lower layer 218 do not match Referring now to FIG. 7, a graphical representation illustrating a device temperature as a function of a heat transfer coefficient during testing or simulation is schematically depicted. As illustrated, the conventional (prior art) PCB substrates have a much greater device temperature as a function of the cold plate heat transfer coefficient. As illustrated, the conventional (prior art) PCB substrates have a device temperature that is mostly above or just below 175 degrees Celsius. As illustrated, the driver board assembly 400, the driver board assembly 500, and the driver board assembly 600 have a device temperature that is mostly below 175 degrees Celsius. This is significantly less of a device temperature as a function of the cold plate heat transfer coefficient than that of the conventional (prior art) PCB substrates. Further, the driver board assembly 500 has the best heat transfer properties between the driver board assembly 400 and the driver board assembly 600.

Figure 8:
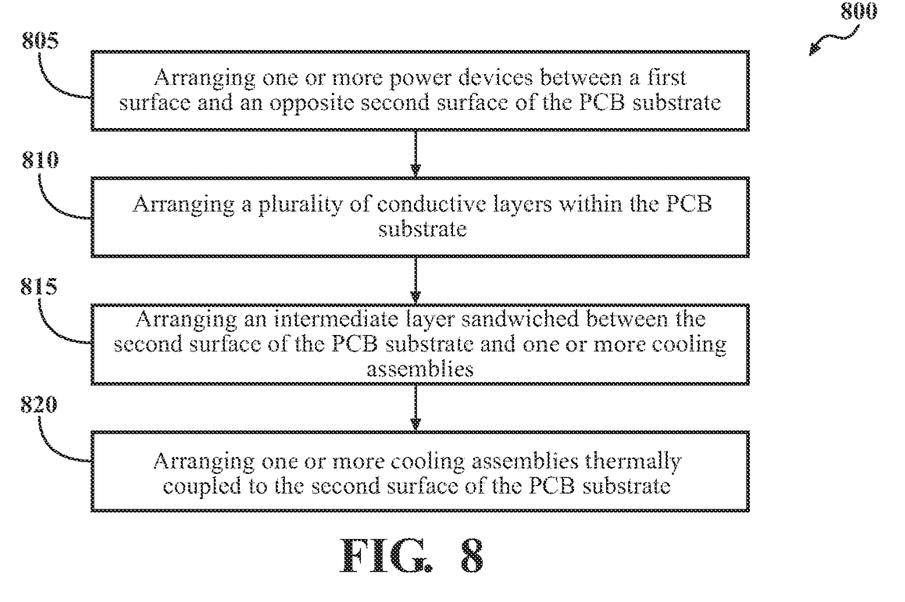
FIG. 8 illustrates a flow chart depicting an example method of assembling a driver board assembly, according to one or more embodiments shown and described herein.

Referring now to FIG. 8, a flowchart depicting an example method 800 for assembling a driver board assembly 100 according to one or more embodiments described herein, is depicted. It is noted that a greater or fewer number of steps in any order may be included without departing from the scope of the present disclosure.

In particular, at block 805, the one or more power devices 204 may be arranged within the PCB substrate 110 between the between the first surface 112 and the second surface 114. For example, and as described above, the one or more power devices 204 may include a plurality of power devices arranged in pairs of two that includes the first power device 346a and the second power device 346b. For example, and as noted above, an inverter topology may include three pairs of power devices 204. In embodiments, arranging the one or more power devices 204 within the PCB substrate 110 may include mounting each of the power devices 204 in a power device assemblies 348, each including a conductive substrate 350. The one or more power device assemblies 348 may be embedded (e.g., laminated) within the PCB substrate 110 as described above.

The method 800, at block 810, includes arranging a plurality of conductive layers 140 within the PCB substrate 110. For example, and as noted above, the plurality of conductive layers 140 may be arranged in a variety of ways such that the N-conductive layer architecture 314 may electrically couple the one or more power devices 204 to a current source (for example, a battery), the O-conductive layer architecture 316 may output an inverted or converted current signal (e.g., AC instead of DC), as described above, to, for example, a motor, and the P-conductive layer architecture 318 may complete the circuit by coupling the one or more power devices 204 back to the current source.

At block 815, the method 800 further includes arranging an intermediate layer 202 sandwiched between the second surface 114 of the PCB substrate 110 and one or more cooling assemblies 200. In some embodiments, the intermediate layer 202 may be a direct bonded copper layer 402. The direct bonded copper layer 402 is sandwiched between the second layer 114 of the PCB substrate 110 and the upper layer 222 of the cold plate 220. It should be appreciated that a portion of the direct bonded copper layer 402 may be electrically patterned similarly to the electrical pattern of the lower layer 218. The direct bonded copper layer 402 may be mounted or coupled to the second layer 114 of the PCB substrate 110 and the upper layer 222 of the cold plate 220 via a plurality of bonding techniques, such as silver sintering, soldering, copper sintering, and the like.

In other embodiments, the intermediate layer 202 may be is a ceramic layer 502 sandwiched between the second layer 114 of the PCB substrate 110 and the upper layer 222 of the cold plate 220. It should be appreciated that a portion of the ceramic layer 502 may be electrically patterned similarly to the electrical pattern of the lower layer 218. The ceramic layer 502 may be mounted or coupled to the second layer 114 of the PCB substrate 110 and the upper layer 222 of the cold plate 220 via a plurality of bonding techniques, such as silver sintering, soldering, copper sintering, and the like.

In other embodiments, the intermediate layer 202 may be a substrate 602 such as a direct bonded aluminum substrate or a direct insulated metal substrate. The substrate 602 is sandwiched between the second layer 114 of the PCB substrate 110 and a portion of the substrate 602 is integrated into the cold plate 220. A portion of the substrate 602 may be electrically patterned similarly to the electrical pattern of the lower layer 218. The substrate 602 may be mounted or coupled to the second layer 114 of the PCB substrate 110 via a plurality of bonding techniques, such as silver sintering, soldering, copper sintering, and the like.

At block 820, the method 800 further includes arranging one or more cooling assemblies, such as a cold plate 220, coupled to the intermediate portion to thermally couple the PCB substrate to the one or more cooling assemblies 200.

It should now be understood that embodiments of the present disclosure are directed to driver board assemblies and method of assembling a driver board. In the embodiments described herein driver board assemblies include a PCB substrate. The PCB substrate may include one or more embedded power devices and a plurality of conductive layers that together may create one of an inverter topology and a converter topology. The plurality of conductive layers also provide thermal paths for directing heat to one or more cooling assemblies, which may be thermally coupled to the PCB substrate. Further, an intermediate layer is positioned between the PCB substrate and the cooling assembly. In embodiments, the intermediate layer is a direct bonded copper layer, a ceramic layer, or a substrate such as a direct bonded aluminum substrate or a direct insulated metal substrate. As such, this arrangement permits the PCB substrate and the cooling assembly to not have any grease layers and/or insulation layers. Accordingly, the arrangement provides numerous advantages including a lower thermal resistance.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A circuit board assembly comprising;
a printed circuit board (PCB) substrate having a first surface and an opposite second surface, the second surface having a first electrical pattern;
a cooling assembly thermally coupled to the second surface of the PCB substrate;
an intermediate layer sandwiched between the second surface of the PCB substrate and the cooling assembly;
one or more power devices embedded within layers of the PCB substrate between the first surface and the second surface; and
a plurality of conductive layers arranged within the PCB substrate, the plurality of conductive layers configured to electrically couple the one or more power devices and thermally couple the one or more power devices to the cooling assembly,
wherein at least a portion of the intermediate layer has a second electrical pattern that is similarly patterned to the first electrical pattern of the second surface of the PCB substrate, and
wherein the first electrical pattern and the second electrical pattern are a three-phase electrical pattern.

2. The circuit board assembly of claim 1, wherein the cooling assembly comprises:
a plurality of vias arranged within the PCB substrate.

3. The circuit board assembly of claim 2, wherein:
the cooling assembly is a cold plate mounted to the intermediate layer opposite the second surface of the PCB substrate, and
wherein the intermediate layer thermally couples the cold plate to the plurality of conductive layers.

4. The circuit board assembly of claim 3, wherein an upper surface of the cold plate includes a silver plated aluminum layer.

5. The circuit board assembly of claim 3, wherein the intermediate layer is a direct bonded copper layer.

6. The circuit board assembly of claim 5, wherein the first electrical pattern of the second surface of the PCB substrate and the second electrical pattern of the direct bonded copper layer both includes a U, V, W conductive layer architectures define the three-phase electrical pattern and a P and N conductive layer architectures.

7. The circuit board assembly of claim 3, wherein the intermediate layer is a ceramic layer.

8. The circuit board assembly of claim 7, further comprising:
an upper solder paste positioned between the second surface of the PCB substrate and the ceramic layer;
a lower solder paste positioned between the ceramic layer and the cold plate; and
a solder layer positioned between the upper solder paste and the lower solder paste to mount the ceramic layer to the cold plate.

9. The circuit board assembly of claim 8, wherein an upper surface of the cold plate includes a silver plated aluminum layer.

10. The circuit board assembly of claim 8, wherein the first electrical pattern of the second surface of the PCB substrate and the second electrical pattern of the ceramic layer both includes a U, V, W conductive layer architectures define the three-phase electrical pattern and a P and N conductive layer architectures.

11. A circuit board assembly comprising;
a printed circuit board (PCB) substrate having a first surface and an opposite second surface, the second surface having a first electrical pattern;
a cooling assembly thermally coupled to the second surface of the PCB substrate;
a second substrate sandwiched between the second surface of the PCB substrate and the cooling assembly, the second substrate having an upper substrate surface and an opposite lower substrate surface, the upper substrate surface having a first conductive layer, the first conductive layer having a first thickness, the lower substrate surface having a second conductive layer, the second conductive layer having a second thickness, the second thickness being greater than the first thickness;
one or more power devices embedded within layers of the PCB substrate between the first surface and the second surface; and
a plurality of conductive layers arranged within the PCB substrate, the plurality of conductive layers configured to electrically couple the one or more power devices and thermally couple the one or more power devices to the cooling assembly,
wherein the first conductive layer of the second substrate has a second electrical pattern that is similarly patterned to the first electrical pattern of the second surface of the PCB substrate, and
wherein the first electrical pattern and the second electrical pattern are a three-phase electrical pattern.

12. The circuit board assembly of claim 11, wherein the cooling assembly comprises:
a plurality of vias arranged within the PCB substrate; and
a cold plate mounted to the second substrate opposite the second surface of the PCB substrate, wherein the second substrate thermally couples the cold plate to the plurality of conductive layers.

13. The circuit board assembly of claim 12, wherein the second substrate is an insulated metal substrate such that the first conductive layer and the second conductive layer are made of a metal material.

14. The circuit board assembly of claim 13, wherein the second conductive layer is a heat sink fin assembly and configured to be mounted to an upper surface of the cold plate.

15. The circuit board assembly of claim 14, wherein the second conductive layer is mounted to the upper surface of the cold plate via a brazing when the cold plate is made of a metal material or via a plastic aluminum direct bond when the cold plate is made of a plastic material.

16. The circuit board assembly of claim 15, wherein the first electrical pattern of the second surface of the PCB substrate and the second electrical pattern of the first conductive layer both includes a U, V, W conductive layer architectures that define the three-phase electrical pattern and a P and N conductive layer architectures.

17. The circuit board assembly of claim 12, wherein the second substrate is a direct bonded aluminum substrate such that the first conductive layer and the second conductive layer are made of an aluminum material.

18. The circuit board assembly of claim 17, wherein the second conductive layer is a heat sink fin assembly and configured to be mounted to an upper surface of the cold plate.

19. The circuit board assembly of claim 18, wherein the first electrical pattern of the second surface of the PCB substrate and the second electrical pattern of the first conductive layer both includes a U, V, W conductive layer architectures for the three-phase electrical pattern and a P and N conductive layer architectures.

20. A method of forming a circuit board assembly, the method comprising:
  arranging one or more power devices within layers of a printed circuit board (PCB) substrate between a first surface and an opposite second surface of the PCB substrate;
  arranging a plurality of conductive layers within the PCB substrate, the plurality of conductive layers configured to electrically couple the one or more power devices and thermally couple the one or more power devices to a cooling assembly;
  arranging an intermediate layer sandwiched between the second surface of the PCB substrate and the cooling assembly; and
  arranging the cooling assembly to couple to the intermediate layer and thermally couple to the second surface of the PCB substrate,
  wherein the intermediate layer has a first electrical pattern that is similarly patterned to a second electrical pattern of the second surface of the PCB substrate, and
  wherein the first electrical pattern and the second electrical pattern are a three-phase electrical pattern.

* * * * *

UNITED STATES PATENT AND TRADEMARK OFFICE
CERTIFICATE OF CORRECTION

PATENT NO. : 11,497,112 B2
APPLICATION NO. : 17/119364
DATED : November 8, 2022
INVENTOR(S) : Feng Zhou, Hiroshi Ukegawa and Shohei Nagai It is certified that error appears in the above-identified patent and that said Letters Patent is hereby corrected as shown below:

On the Title Page

Item (71), applicant 2, address, before "(JP)", delete "Toyota" and insert --Toyota-shi, Aichi-Ken--, therefor.

Item (72), inventor 2, address, before "(JP)", delete "Nisshin" and insert --Nisshin-shi, Aichi-Ken--, therefor.

Item (72), inventor 3, address, before "(JP)", delete "Toyota" and insert --Toyota-shi, Aichi-Ken--, therefor.

Item (73), assignee 2, address, before "(JP)", delete "Aichi-Ken" and insert --Toyota-shi, Aichi-Ken--, therefor.

Signed and Sealed this
Thirty-first Day of January, 2023

Katherine Kelly Vidal
*Director of the United States Patent and Trademark Office*